United States Patent
Honda

(10) Patent No.: US 7,889,770 B2
(45) Date of Patent: Feb. 15, 2011

(54) SEMICONDUCTOR LASER DEVICE

(75) Inventor: Shoji Honda, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 0 days.

(21) Appl. No.: 11/898,576

(22) Filed: Sep. 13, 2007

(65) Prior Publication Data

US 2008/0013576 A1    Jan. 17, 2008

Related U.S. Application Data

(63) Continuation of application No. 10/503,938, filed on Aug. 16, 2004, now Pat. No. 7,280,572.

(30) Foreign Application Priority Data

Mar. 25, 2002  (JP) .............................. 2002-083661

(51) Int. Cl.
H01S 3/04  (2006.01)
(52) U.S. Cl. .......................................... 372/36; 372/34
(58) Field of Classification Search ................... 372/34, 372/36
See application file for complete search history.

(56) References Cited

U.S. PATENT DOCUMENTS

| | | | |
|---|---|---|---|
| 4,567,598 A | 1/1986 | Noguchi et al. | |
| 4,763,335 A | 8/1988 | Chamuel | |
| 5,324,286 A | 6/1994 | Fowle | |
| 5,519,720 A | 5/1996 | Hirano et al. | |
| 5,614,735 A | 3/1997 | Kitamura | |
| 6,181,720 B1 | 1/2001 | Kanemoto et al. | |
| 6,481,874 B2 * | 11/2002 | Petroski .................. | 362/373 |
| D476,296 S * | 6/2003 | Koizumi ................... | D13/182 |
| 6,845,112 B2 | 1/2005 | Yamamoto et al. | |
| 2003/0165167 A1 | 9/2003 | Ichikawa et al. | |
| 2004/0013142 A1 * | 1/2004 | Tsuji .......................... | 372/43 |
| 2004/0066815 A1 * | 4/2004 | Okazaki ..................... | 372/43 |

FOREIGN PATENT DOCUMENTS

| | | |
|---|---|---|
| JP | 59-151484 | 8/1984 |
| JP | 61-239688 | 10/1986 |
| JP | 62-8655 | 1/1987 |
| JP | 62-166588 | 7/1987 |
| JP | 3-217067 | 9/1991 |
| JP | 4-121769 | 10/1992 |
| JP | 06-037401 A | 2/1994 |
| JP | 6-152067 | 5/1994 |
| JP | 06-268336 | 9/1994 |

(Continued)

*Primary Examiner*—Minsun Harvey
*Assistant Examiner*—Phillip Nguyen
(74) *Attorney, Agent, or Firm*—Arent Fox LLP

(57) ABSTRACT

A semiconductor laser beam device, comprising a stem type package having a base part and a heat sink part, wherein the heat sink part is cylindrically formed so as to be concentric to the base part, a groove is formed along the axial direction of the heat sink part, and a semiconductor laser beam element is disposed at the bottom part of the inner wall surfaces of the groove whereby the radiating capability of the semiconductor laser beam device can be increased by increasing the volume of the heat sink part, and the element can be protected by the groove.

12 Claims, 9 Drawing Sheets

FOREIGN PATENT DOCUMENTS

| | | |
|---|---|---|
| JP | 06-283805 | 10/1994 |
| JP | 07-335982 | 12/1995 |
| JP | 08-213708 | 8/1996 |
| JP | 08-242041 | 9/1996 |
| JP | 10-163526 | 6/1998 |
| JP | 10-209551 | 8/1998 |
| JP | 11-251689 | 9/1999 |
| JP | 2000-183440 | 6/2000 |
| JP | 2001-297477 | 10/2001 |
| JP | 2001-308437 | 11/2001 |
| JP | 2001-318279 | 11/2001 |
| JP | 2002-076492 | 3/2002 |

* cited by examiner

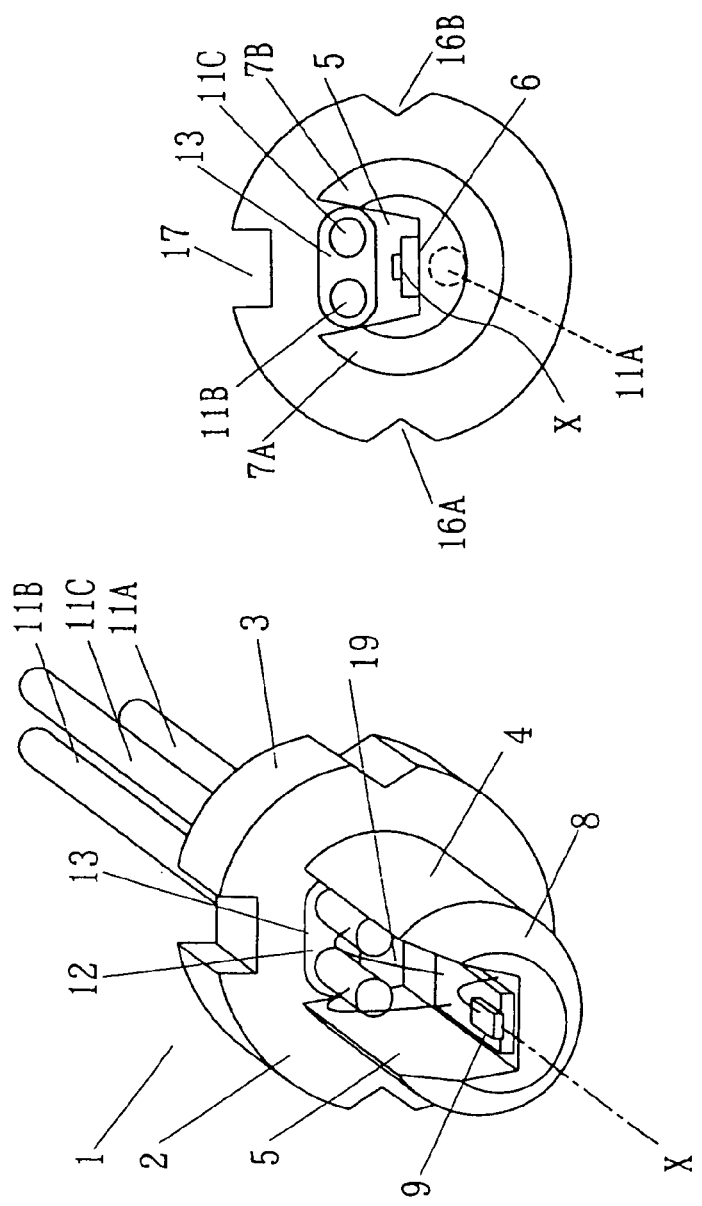

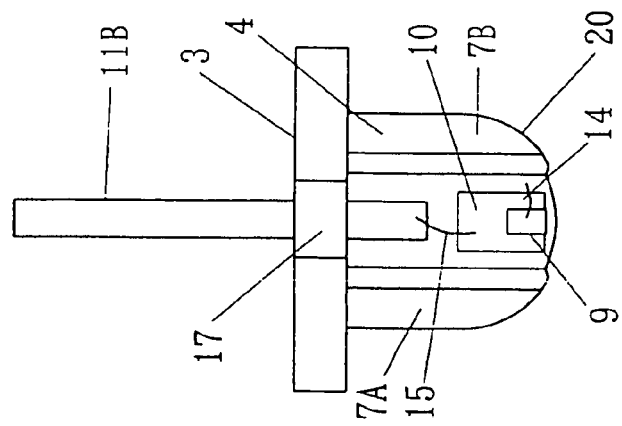
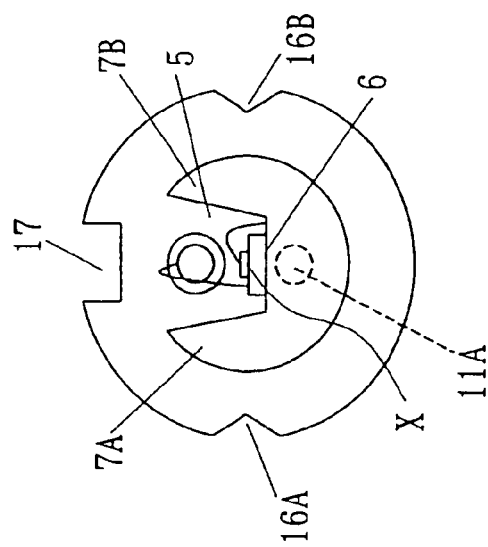
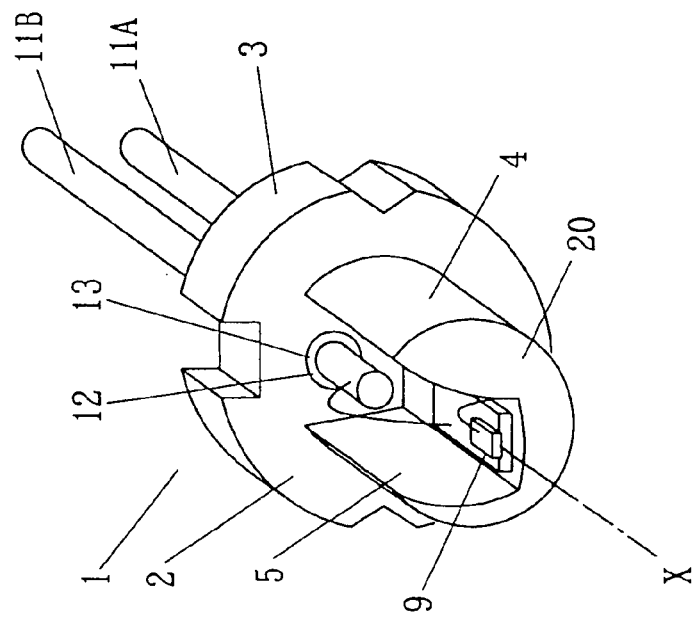

FIG.4A
FIG.4B
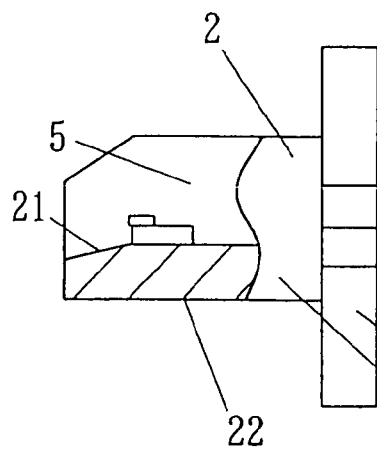
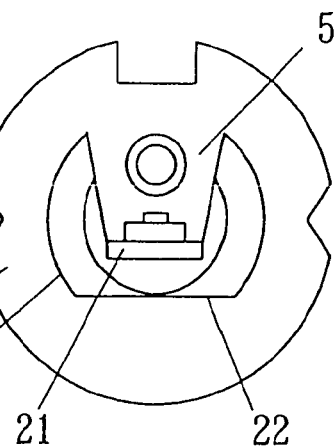
FIG.5A
FIG.5B
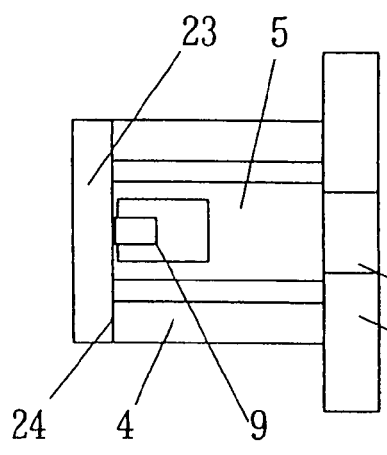
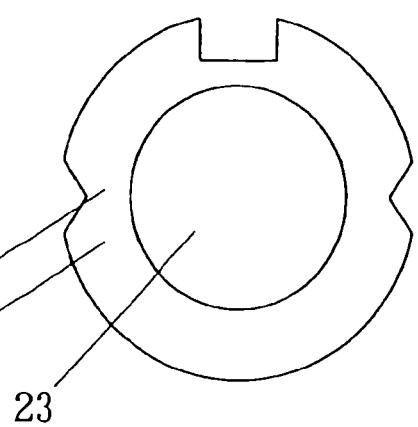
FIG.6
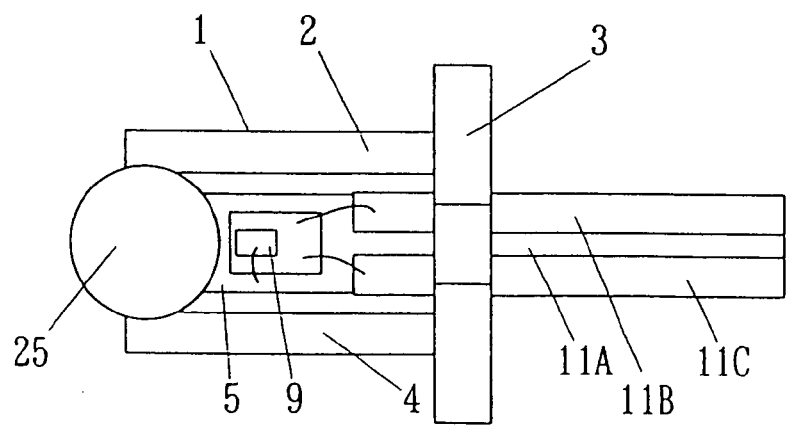

SEMICONDUCTOR LASER DEVICE

CROSS-REFERENCE TO RELATED APPLICATIONS

This is a continuation application which claims the benefit of pending U.S. patent application Ser. No. 10/503,938, filed Aug. 16, 2004, which is a National Stage of Application No. PCT/JP03/03554 filed Mar. 24, 2003. The disclosures of the prior applications are hereby incorporated herein in their entirety by reference.

TECHNICAL FIELD

The present invention relates to a semiconductor laser device for use as a light source for an optical disk such as a CD, CD-R/RW, DVD, DVD-R/RW, DVD-Blu-Ray disk, and the like. More particularly, the present invention relates to a semiconductor laser device having a compact package suitable for use as a slim (thin) pickup for an optical disk, and to a package therefor.

BACKGROUND ART

Currently used half-height pickups employ semiconductor laser devices with a 5.6-mm-diameter stem. For slim pickups, packages with a D-shaped stem, obtained by cutting off a portion of a 5.6-mm-diameter stem, an I-shaped stem, obtained by cutting off opposite portions of a 5.6-mm-diameter stem, or the like have been proposed. Also proposed are packages with a 3.5- or 3.3-mm-diameter stem (see an exterior view shown in FIG. 13). However, packages with these 3.5- and 3.3-mm-diameter stems are, as will be understood from the external view thereof shown in FIG. 13, simply down-scaled versions of a package with a 5.6-mm-diameter stem, and thus have, inconveniently, accordingly smaller heat sinks on which to place laser devices. Constructions with increased heat sink volumes are also known, for example in Patent Publication 1. However, even these constructions, with semicircular heat sinks, do not offer sufficient volumes.

High-output semiconductor laser devices for CD-Rs and DVD-Rs require larger currents and higher voltages, and thus generate accordingly larger amounts of heat. This makes it difficult to guarantee normal operation at high temperatures of 70° and above by the use of a stem with a small heat-dissipation volume such as a 3.3-mm-diameter stem. Thus, it is important to devise how to maximize the heat-dissipation volume.

DISCLOSURE OF THE INVENTION

The present invention aims to achieve at least one, and hopefully more, of the following objects: to achieve improved heat dissipation; to obtain compact packages; to protect elements, and to reduce the number of lead pins.

To achieve the above objects, according to the present invention, a semiconductor laser device is characterized in that a groove is formed in a cylindrical heat sink along the axial direction thereof and in that a semiconductor laser element is placed on an inner wall surface of the groove.

This helps increase the heat sink volume and thereby enhance the heat dissipation of the semiconductor laser device.

According to the present invention, a semiconductor laser device having a package comprising a circular base and a heat sink and having a semiconductor laser element placed on the heat sink is characterized in that the heat sink is cylindrical and concentric with the base, in that a groove is formed in the heat sink along the axial direction thereof, and in that the semiconductor laser element is placed on an inner wall surface of the groove.

With this construction, the omission of the conventionally used airtight structure helps reduce the number of components and the number of assembly steps. Moreover, it is possible to increases the area over which the heat sink makes contact with outside air.

According to the present invention, the groove is formed so deep as to include the center axis of the cylindrical heat sink.

This makes it possible to place the semiconductor laser element with the optical axis thereof aligned with the center axis of the cylindrical heat sink. Thus, it is possible to prevent misalignment of the optical axis resulting from rotation during assembly into a pickup apparatus or the like.

According to the present invention, the groove is so shaped as to completely house therein the semiconductor laser element.

When the semiconductor laser element is housed in a groove whose depth is much greater than its own height in this way, the walls serve to protect the element.

According to the present invention, the groove is so shaped as to completely house therein the semiconductor laser element along with bonding wires connected thereto.

This permits the semiconductor laser element and the bonding wires to be protected by the side walls.

According to the present invention, the walls located at both sides of the groove extend to a height higher than the semiconductor laser element.

When the semiconductor laser element is placed so as to be located between walls whose height is much greater than its own height in this way, the walls serve to protect the element.

According to the present invention, the groove is formed by cutting off an arc surface of the heat sink equivalent to a center angle of 180 degrees or less.

With this construction, the surface located at the bottom of the groove is a flat surface parallel to the center axis of the cylinder, and the semiconductor laser element is placed on this flat surface.

According to the present invention, a lead pin is provided that, at one end thereof, penetrates the base, and the lead pin is, at the other end thereof, located in the groove.

With this construction, a wire can be bonded inside the groove. This makes it possible to securely protect the wire with the heat sink.

According to the present invention, two lead pins are provided that, at one ends thereof, penetrate the base, and the lead pins are, at one ends thereof, located in the groove.

With this construction, even with a semiconductor laser device that incorporates a light-receiving element, a lead pin that penetrates the base can be, at one end, placed inside the groove, and thus a wire can be bonded inside the groove. This makes it possible to securely protect the wiring for the light-receiving element with the heat sink. Moreover, it is also possible to make the package compact.

According to the present invention, the heat sink has a tapered surface formed along the outer edge of the tip end thereof.

Forming the taper surface in this way prevents an edge from shaving the portion, typically formed of aluminum or the like, of an optical pickup where it receives the laser device.

According to the present invention, the heat sink has the tip end thereof formed into a spherical surface.

This permits the tip end of the semiconductor laser device to be shaped like the tip of a ballpoint pen, and thus makes it easy to pan and tilt the device for adjustment during assembly into a pickup apparatus or the like. Specifically, it is easy to perform so-called pan-and-tilt adjustment whereby, with the tip end of the laser device placed in a semispherical dent formed in the pickup apparatus, the lead-pin-side portion of the device is so moved as to bring the optical axis into an optimally aligned position.

According to the present invention, the heat sink has the bottom surface thereof formed flat.

By making the bottom surface flat in this way, it is possible to stably hold the package when wires are bonded to the semiconductor laser element and other components.

According to the present invention, a flat-plate-shaped optical element is attached to the front end surface of the heat sink.

By incorporating into the semiconductor laser device an optical element, which is conventionally provided separately therefrom, in this way, it is possible to simplify the optical alignment required in an optical pickup or in an optical communication transmitter.

According to the present invention, a spherical optical element is attached to the front end surface of the heat sink.

By incorporating into the semiconductor laser device an optical element, which is conventionally provided separately therefrom, with optical alignment performed beforehand in this way, it is possible to simplify the optical alignment required when the device is applied to an optical pickup, an optical communication transmitter, or an optical fiber module.

According to the present invention, the base and the heat sink are formed of the same metal.

This permits the base and the heat sink to be formed integrally. For example, these can be formed simultaneously by pressing a sheet-shaped material, or by cutting a column-shaped material.

According to the present invention, a semiconductor laser device is characterized in that a groove so deep as to completely house therein a semiconductor laser element is formed in a columnar heat sink, and in that the semiconductor laser element is placed on the bottom of the groove.

With this construction, it is possible to protect the element with the groove.

According to the present invention, a semiconductor laser device comprising a semiconductor laser element and a columnar heat sink having a flat surface that is parallel to the optical axis of the semiconductor laser element and on which the semiconductor laser element is placed is characterized in that the heat sink has a wall formed integrally therewith at one of the left-hand and right-hand sides of the flat surface with respect to the optical axis, and in that the summit of the wall is located higher than the semiconductor laser element and than the bonding wire connected thereto.

In this way, the presence of the wall helps increase the heat-dissipation volume or surface area and thereby achieve satisfactory heat dissipation.

BRIEF DESCRIPTION OF DRAWINGS

FIG. 2 shows a second embodiment of the invention, in a perspective view (a), a front view (b), and a plan view (c).

FIG. 3 shows a third embodiment of the invention, in a perspective view (a), a front view (b), and a plan view (c).

FIG. 4 shows a fourth embodiment of the invention, in a partly cut-out side view (a) and a front view (b).

FIG. 5 shows a fifth embodiment of the invention, in a plan view (a) and a front view (b).

FIG. 6 shows a sixth embodiment of the invention, in a plan view.

BEST MODE FOR CARRYING OUT THE INVENTION

Hereinafter, embodiments of the present invention will be described with reference to the accompanying drawings.

Figure 1C:
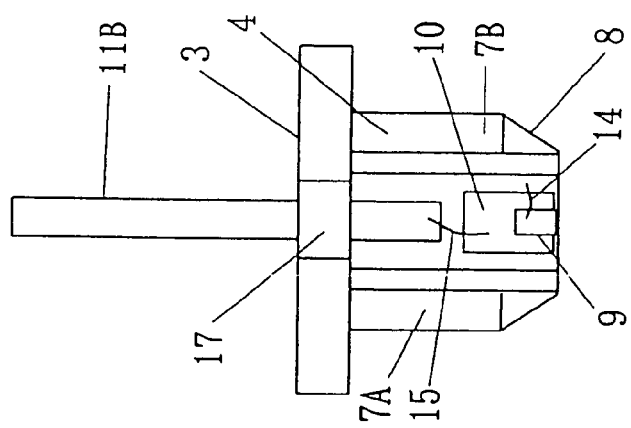
FIG. 1 shows a first embodiment of the invention, in a perspective view (a), a front view (b), and a plan view (c).
Figure 1B:
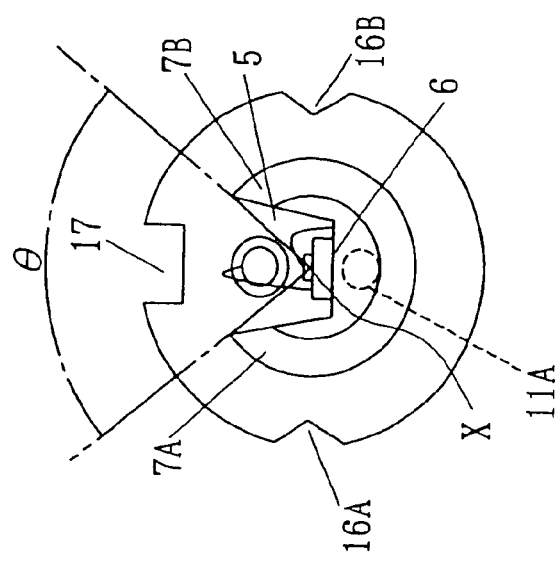
Figure 1A:
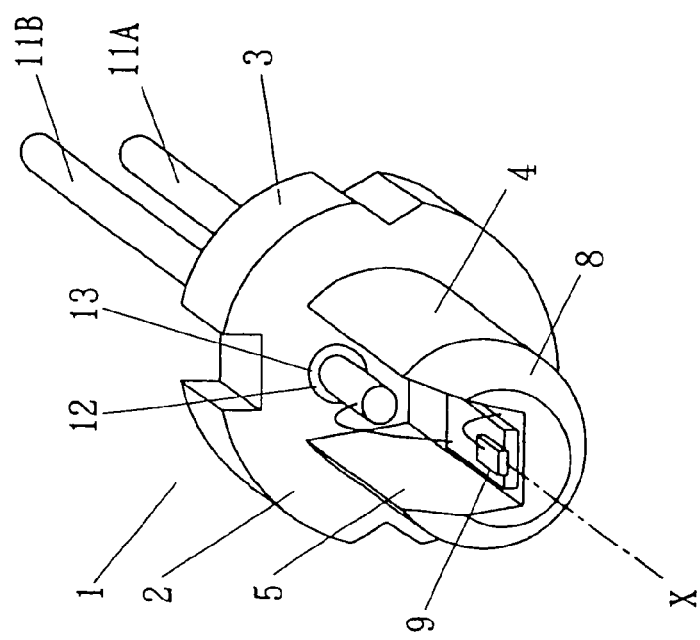

FIG. 1 shows the semiconductor laser device of a first embodiment of the invention, in a perspective view (a), a front view (b), and a plan view (c).

The semiconductor laser device 1 has a stemmed package 2. This package 2 consists essentially of a base 3 and a heat sink 4.

The base 3 basically has the shape of a disk with a diameter of 3.3 mm and a thickness of 1 mm, and is built as a disk-shaped metal member. The heat sink 4 basically has the shape of a cylinder with a diameter of 2.9 mm and a length of 2.5 mm, and is built as a column-shaped metal member of which a portion is cut out to form a depression. The base 3 and the heat sink 4 are arranged concentrically so that, as seen from the front, their centers coincide. The center X of the base 3 and the heat sink 4 is so located as to coincide with the optical axis X of the semiconductor element described later.

The heat sink 4 has a groove 5 formed therein. The groove 5 extends along the center axis of the cylinder, and cuts the upper and lower flat surfaces of the cylinder. Thus, the heat sink 4 is U-shaped as seen from the front. The groove 5 is so formed as to be increasingly wide from bottom to top, specifically 1.5 mm wide at the top end and 1.0 mm wide at the bottom end. The groove 5 is so formed that the arc portion of the cylinder cut off as the groove 5 (i.e., the arc portion of the cylinder of which the chord is described by the top end of the groove 5) covers, when converted to a center angle about the center axis of the cylinder, an angle θ smaller than 180 degrees. This angle θ is set to be smaller than 90 degrees, but may be set to be larger than 90 degrees so long as it is smaller than 180 degrees. The groove 5 is so formed that the bottom surface thereof is located deeper than the center axis X of the cylinder. The surface 6 located at the bottom of the groove 5 is formed into a flat surface parallel to the center axis X of the cylinder. This surface 6 is used as the surface on which the semiconductor element described later is placed.

The heat sink 4 has walls 7 formed integrally therewith at both sides (on the left-hand and right-hand sides with respect to the above-mentioned axis X) of the flat surface 6. That is, it has, on the left-hand and right-hand sides of the groove 5, left-hand and right-hand walls 7A and 7B that are higher than the flat surface 6 at the bottom of the groove 5. Between these walls 7A and 7B, the element 9 described later is placed.

The heat sink 4 has the base end thereof formed integrally with the base 3. One way to form the package 2 is to form the base 3 and the heat sink 4 as separate members and then join them together into a single member with a connecting material such as solder. Another way to form the package 2 is to form the base 3 and the heat sink 4 integrally as a single member. When the base 3 and the heat sink 4 are formed as separate members, it is preferable that the base 3 be formed of copper or copper-based alloy, which has low thermal resistance, or iron or iron-based alloy, and that the heat sink 4 be formed of copper or copper-based alloy, which has low thermal resistance. When the base 3 and the heat sink 4 are formed integrally, it is preferably that they be formed of copper or copper-based alloy, which has low thermal resistance. When the base 3 and the heat sink 4 are formed integrally, they can be formed simultaneously by pressing a sheet-shaped material, or by cutting a column-shaped material.

The heat sink 4 has a tapered surface 8 formed around the edge of the tip end thereof so that the heat sink 4 tapers off at the tip end thereof. Forming this taper surface 8 helps prevent an edge from shaving the portion, typically formed of aluminum or the like, of an optical pickup where it receives the laser device.

Moreover, the heat sink 4 has the outer circumferential surface thereof formed as a curved surface describing an arc about the axis X and including left-hand and right-hand walls 7A and 7B. Thus, when the position of the laser device in the portion of an optical pickup where it receives the laser device is adjusted by rotating the laser device, the outer circumferential curved surface thereof serves as a guide, permitting smooth movement of the laser device during adjustment.

The semiconductor laser device 1 has a semiconductor laser element 9, as a semiconductor element, placed on the package 2. The semiconductor laser element 9 is placed on a fitting surface of the heat sink 4, specifically, in this example, on a flat surface 6 that is part of the inner wall surface of the groove 5, with a submount 10 interposed in between. For enhanced heat dissipation, it is preferable that the semiconductor laser element 9 be placed in a junction-down arrangement, i.e., with the light-emitting point thereof lopsided toward the submount 10.

In the semiconductor laser device 1, it is possible to use a semiconductor laser element 9 of any type, ranging from infrared to ultraviolet regions. Among these, it is preferable to use a semiconductor laser element of a red- or blue-region type that exhibits poorer heat dissipation than a semiconductor laser element of an infrared-region type and that thus requires a better heat dissipation environment, because this helps improve the heat dissipation of such a semiconductor laser element.

The submount 10 is formed as a member that dissipates heat well, and is formed of, for example, a semiconductor material such as silicon or aluminum nitride. To further enhance the heat dissipation of the semiconductor laser element 9, the semiconductor laser element 9 may be fitted directly to the fitting surface of the heat sink 4 without the submount 10 interposed in between.

The semiconductor laser element 9 is placed inside the groove 5, and is thus arranged sandwiched between the walls 7A and 7B, of which the height is much greater than the height of the semiconductor laser element 9 itself. Thus, these walls serve to protect the element.

The semiconductor laser device 1 is provided with a plurality of lead pins 11A and 11B that are fixed to the package 2. In this embodiment, two lead pines 11A and 11B are so arranged as to sandwich the center X of the base 3. One lead pin 11A is jointed, by welding or the like, to the base 3, and is thereby fixed to the base 3 in a state electrically conductive therewith. The other lead pin 11B is, at one end, put through a through hole 12 formed in the base 3, and is fixed to the base 3 in a state electrically insulated from the base 3 by an insulating member 13 placed inside the through hole 12. This lead pin 11B, at one end, penetrates the base 3 and is located inside the groove 5.

The one lead pin 11A is connected, via the base 3, the heat sink 4, a bonding wire 14, and the like, to one electrode of the semiconductor laser element 9. The other lead pin 11B is connected, via a bonding wire 15 connected to one end thereof, a conductor laid on the submount 10, and the like, to the other electrode of the semiconductor laser element 9. When a voltage needed to drive the semiconductor laser element 9 is applied between the lead pins 11A and 11B, the semiconductor laser element 9 operates, and emits laser light in the direction of the axis X.

For the bonding wires 14 and 15 to be protected by the side walls 7A and 7B, it is preferable that the bonding wires 14 and 15 be arranged inside the groove 5 so as not to protrude from the upper edge of the groove 5. That is, the groove 5 is so shaped as to completely house therein the semiconductor laser element 9, the submount 10, and the bonding wires 14 and 15.

In the base 3 of the semiconductor laser device 1 are formed, as conventionally practiced, a pair of triangular cuts 16A and 16B for positioning and a rectangular cut 17 for orientation indication.

The semiconductor laser device 1 as a finished product is shown in FIG. 1, and is incorporated into an optical pickup apparatus or the like so as to be used as a light source therefor. At this time, since the heat sink 4 has the tapered surface 8 at the tip end thereof, it is possible to insert the semiconductor laser device 1 into the position where it is to be mounted. Moreover, the tapered surface 8 formed at the tip end of the semiconductor laser device 1 prevents an edge from shaving the portion, typically formed of aluminum or the like, of an optical pickup where it receives the laser device. In this way, it is possible to prevent the optical system from being adversely affected by metal particles produced as a result of shaving by an edge. When the semiconductor laser device is incorporated in an optical pickup apparatus or the like for actual use, the heat sink 4 side flat surface of the base 3 functions as a reference surface for positioning.

Figure 10A:
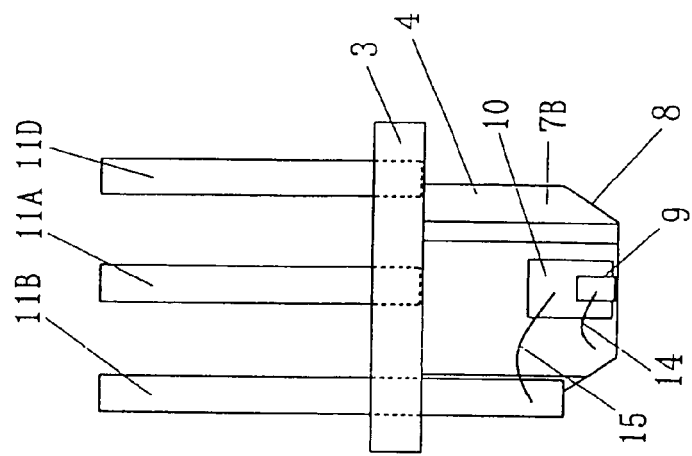
FIG. 10 shows a tenth embodiment of the invention, in a perspective view (a), a front view (b), and a plan view (c).
Figure 10B:
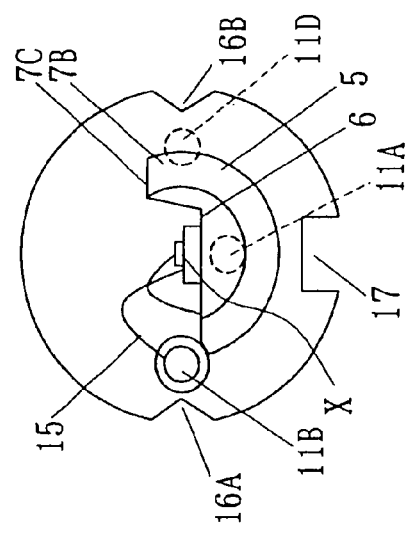
Figure 10C:
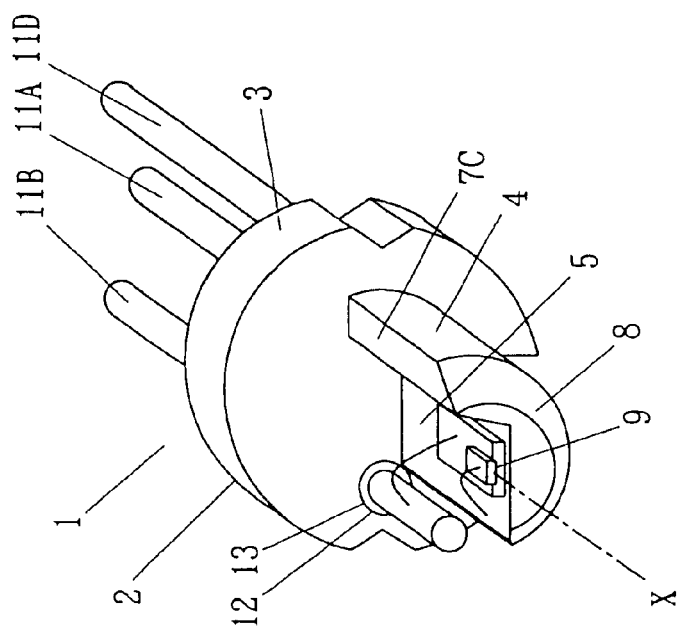
Figure 13:
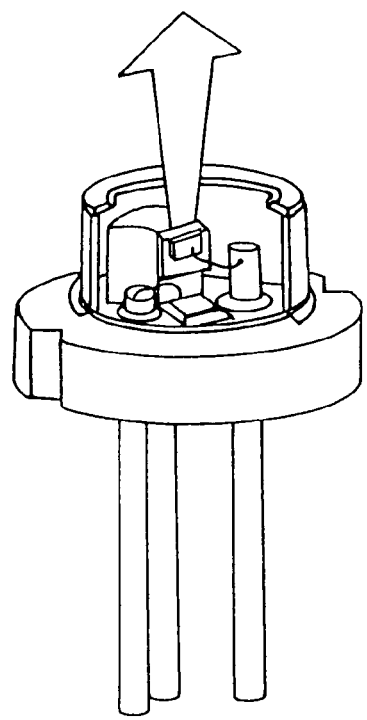
FIG. 13 shows a conventional example, in a partly cut-out perspective view.

In the embodiment shown in FIG. 1, the heat sink 4 has a volume of 11.1 mm$^3$, which is about ten times the comparable volume, specifically 1.1 mm$^3$, in the conventional type (with a diameter of 3.5 mm) shown in FIG. 10. The overall volume of the package 2 (the total volume of the base 3 and the heat sink 4) is 20.7 mm$^3$, which is about twice the comparable volume, specifically 10.7 mm$^3$, in the conventional type shown in FIG. 13. The proportion of the volume of the heat sink 4 in the overall volume of the package 2 is about 53% (11.1/20.7), which is about five times the comparable proportion, specifically about 10% (1.1/10.7), in the conventional type shown in FIG. 13. Thus, it is possible to effectively dissipate the heat generated by the semiconductor laser element 9.

Figure 12:
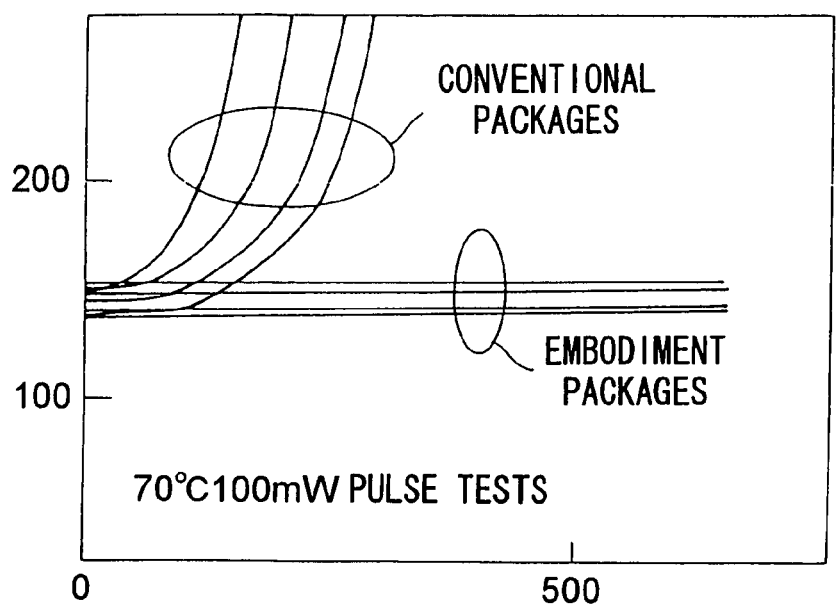
FIG. 12 is a characteristics diagram showing the data obtained in reliability tests.

FIG. 12 shows the results of reliability tests in which a semiconductor laser device having a red-region semiconductor laser element and designed for a DVD-R was fed with 100 mW pulses in a 70° C. environment. Along the horizontal axis is taken the lapse of time, and along the vertical axis is taken the operation current under APC (automatic power control). As will be clear from this graph, it was confirmed that, whereas the conventional construction shown in FIG. 13 made the device inoperable in about 100 hours, the construction of this embodiment permitted the device to operate stably for 500 hours and more.

In this embodiment, the conventional airtight structure employing a cap is not adopted. This helps reduce the number of components and the number of assembly steps. Moreover, it is also possible to increase the area over which the heat sink 4 makes contact with outside air.

It is also possible to build a semiconductor laser device by additionally fitting a cap having a window, as conventionally used, airtightly on the construction shown in FIG. 1.

The semiconductor laser device 1 shown in FIG. 1 does not incorporate a light-receiving element. Accordingly, to monitor the output of the semiconductor laser element 9, it is preferable to arrange, separately from the semiconductor laser device 1, a light-receiving element for front monitoring.

Next, a second embodiment of the invention will be described with reference to FIG. 2. Such components as are found also in the embodiment shown in FIG. 1 are identified with the same reference numerals, and their explanations will be omitted; that is, the following description centers on differences from the first embodiment. The main differences from the first embodiment are the use of a submount 10 incorporating a light-receiving element 18 and the use of one more lead pin for the extraction of the output thereof, making the total number of lead pins three.

In the base 3, there is formed one laterally elongate through hole 12 that is large enough to put two lead pins 11B and 11C therethrough. Through this hole 12 are arranged the two lead pins 11B and 11C apart from each other and in such a way that they are, at one ends, located inside the groove 5. These two lead pins 11B and 11C are fixed to the base 3 in a state insulated from each other and from the base 3 by an insulating member 13. As in the previous embodiment, one end of the lead pin 11B is used for the wiring of the semiconductor laser element 9, and the other lead pin 11C is used for the wiring of the light-receiving element 18 incorporated in the submount 10. The light-receiving element 18 is a PIN-type light-receiving element having a two-terminal structure, with the electrode (in this example, the rear-side electrode) connected to one terminal thereof electrically connected to the heat sink 4, and the other electrode (in this example, the obverse electrode) connected via a bonding wire 19 to the lead pin 11C.

The second embodiment offers the same effects as the first embodiment. In addition, even in the case of a semiconductor laser device incorporating a light-receiving element, the lead pins 11B and 11C that penetrate the base 3 can be, at one ends, located inside the groove 5 so that bonding wires can be laid inside the groove 5. Thus, it is possible to securely protect the wiring for the light-receiving element 18 with the heat sink 4. It is also possible to make the package 2 compact.

Next, a third embodiment of the invention will be described with reference to FIG. 3. Such components as are found also in the embodiment shown in FIG. 1 are identified with the same reference numerals, and their explanations will be omitted; that is, the following description centers on differences from the first embodiment. The main difference from the first embodiment is that the heat sink 4 has, at the tip end thereof, a semispherical curved surface 20 instead of the tapered surface 8. The semiconductor laser element 9 and the submount 10 are so arranged as not to protrude from this curved surface 20. Forming this curved surface 20 permits the tip end of the semiconductor laser device 1 to be shaped like the tip of a ballpoint pen, and thus makes it easy to pan and tilt the device for adjustment during assembly into a pickup apparatus or the like. Specifically, it is easy to perform so-called pan-and-tilt adjustment whereby, with the tip end of the laser device placed in a semispherical dent formed in the pickup apparatus, the lead-pin-side portion of the device is so moved as to bring the optical axis into an optimally aligned position.

In the third embodiment, the semiconductor laser element 9 can be moved slightly frontward or rearward along the direction of the axis X (for example toward the base 3) from the position shown in FIG. 3. For example, it is possible to place the semiconductor laser element 9 in such a way that the light emission point thereof is equidistant from the curved surface 20. That is, when the curved surface 20 is regarded as part of a sphere, the semiconductor laser element 9 can be placed in such a way that the light emission point thereof is located at the center of the sphere. With this arrangement, the light emission point of the semiconductor laser element 9 does not move during the pan-and-tilt adjustment mentioned above. This makes adjustment easy.

The third embodiment can be applied to the second embodiment and to other embodiments described later.

Next, a fourth embodiment of the invention will be described with reference to FIG. 4. Such components as are found also in the embodiment shown in FIG. 1 are identified with the same reference numerals, and their explanations will be omitted; that is, the following description centers on differences from the first embodiment. The main difference from the first embodiment is that the shape of the heat sink 4 is modified. A first modified point lies in a downward sloped tapered surface 21 being formed at the tip end of the flat surface 6 of the groove 5. Forming this tapered surface 21 helps prevent the light outputted from the semiconductor laser element 9 from being intercepted by the flat surface 6 of the groove 5. The slope angle of the tapered surface 21 is set to be larger than the angle at which the light from the semiconductor laser element 9 diverges in the up and down directions. The angle at which the light from the semiconductor laser element 9 diverges in the up and down directions typically is about 30 degrees, and therefore the slope angle of the tapered surface 21 can be set to be 15 degrees or more, for example an angle in the range from 15 degrees to 20 degrees.

For example, in a case where the heat sink 4 is made longer while the position of the semiconductor laser element 9 is kept unchanged, forming the tapered surface 21 makes it easy to make the heat sink 4 longer. This makes it possible to increase the volume of the heat sink 4, and to increase the heat dissipation area.

A second modified point lies in the bottom surface of the groove 5 being formed into a flat bottom surface 22 instead of the arc-shaped surface. This bottom surface 22 is a flat surface parallel to the surface 6 of the groove 5, and has a larger area than the surface 6. Forming this flat bottom surface 22 makes it possible to stably hold the package 2 when wire bonding is performed on the semiconductor laser element 9 and other components.

The first and second modified points described above may be carried out separately or simultaneously.

The fourth embodiment can be applied to the second and third embodiments and to other embodiments described later.

Next, a fifth embodiment of the invention will be described with reference to FIG. 5. Such components as are found also in the embodiment shown in FIG. 1 are identified with the same reference numerals, and their explanations will be omitted; that is, the following description centers on differences from the first embodiment. The main differences from the first embodiment are that the shape of the heat sink 4 is modified, and that an optical element 23 is added to the tip end thereof.

A first modified point lies in the tip end of the heat sink 4 being left cylindrical without forming the tapered surface 8 there. That is, the tip-end and base-end surfaces of the heat sink 4 have the same shape as seen in a plan view. By giving the tip end of the heat sink 4 such a shape, it is possible to secure a large area on the tip-end surface 24 of the heat sink 4. Thus, it is possible to secure a wide margin for fitting the optical element 23 to the tip-end surface 24 of the heat sink 4.

A second modified point lies in the addition of the optical element 23 to the tip end of the heat sink 4. This optical element 23 is shaped like a flat plate, but may be shaped otherwise so long as it is flat on the surface thereof facing the heat sink 4. For example, a tapered surface like the tapered surface 8 may be formed on the surface of the optical element 23 facing away from the heat sink 4. Used as the optical element 23 is one selected from among a hologram element, a quarter-wave plate, a polarizer plate, a plate-shaped lens, and the like. By incorporating into the semiconductor laser device the optical element 23, which is conventionally provided separately therefrom, it is possible to simplify the optical alignment required in an optical pickup or in an optical communication transmitter.

The first and second modified points described above may be carried out separately or simultaneously.

The fifth embodiment can be applied to the second and fourth embodiments and to other embodiments described later.

Next, a sixth embodiment of the invention will be described with reference to FIG. 6. Such components as are found also in the embodiment shown in FIG. 2 are identified with the same reference numerals, and their explanations will be omitted; that is, the following description centers on differences from the second embodiment. The main differences from the second embodiment are that the shape of the heat sink 4 is modified, and that an optical element 25 is added to the tip end thereof.

The first modified point lies in the tip end of the heat sink 4 being left cylindrical without forming the tapered surface 8 on the outside thereof. Instead, at the tip end of the groove 5, there is formed a dent for receiving the optical element 25. Giving the tip end of the heat sink 4 such a shape makes it possible to securely fit the spherical optical element 25.

The second modified point lies in the spherical optical element 25 being added to the tip end of the heat sink 4. This optical element 25 is used to collimate or condense the light emitted from the semiconductor laser element 9. The optical element 25 is held in the dent formed at the tip end of the heat sink 4, and is fixed thereto with adhesive or the like. By incorporating into the semiconductor laser device the optical element 25, which is conventionally provided separately therefrom, with optical alignment performed beforehand, it is possible to simplify the optical alignment required when the device is applied to an optical pickup, an optical communication transmitter, or an optical fiber module.

The first and second modified points described above may be carried out separately or simultaneously.

The sixth embodiment can be applied to the first, fourth, and other embodiments.

Next, a seventh embodiment of the invention will be described with reference to FIG. 7. Such components as are found also in the embodiment shown in FIG. 1 are identified with the same reference numerals, and their explanations will be omitted; that is, the following description centers on differences from the first embodiment. The main difference from the first embodiment is that the shape of the arc-shaped side surface of the heat sink 4 is modified to a polyhedral shape. The outer circumferential surface of the heat sink 4, which has an arc-shaped portion as seen from the front in the first embodiment, is so modified as to have a polyhedral shape as seen from the front. Modifying this portion to a polyhedral shape makes catching easy. The bottom surface of the heat sink 4, which is an arc-shaped surface in the first embodiment, is here a flat bottom surface 22 as in the fourth embodiment. This bottom surface 22 is a flat surface parallel to the surface 6 of the groove 5, and has a larger area than the surface 6. Forming this flat bottom surface 22 makes it possible to stably hold the package 2 when wire bonding is performed on the semiconductor laser element 9 and other components.

Figure 7:
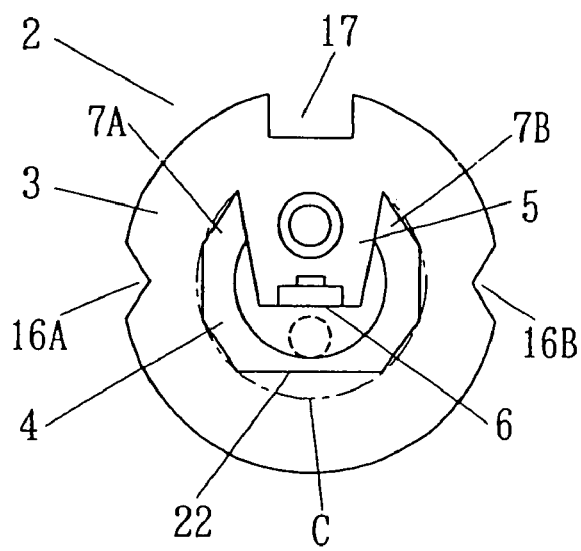
FIG. 7 shows a seventh embodiment of the invention, in a front view.

To permit the heat sink 4 to be stably fitted when inserted into a cylindrical dent, the heat sink 4 is so formed that a plurality of corners on the circumferential surface thereof are inscribed in an imaginary cylinder (indicated by a dash-and-dot line C in FIG. 7). Here, the center axis of the imaginary cylinder coincides with the axis X mentioned earlier.

The seventh embodiment can be applied to the second and other embodiments.

Figure 8:
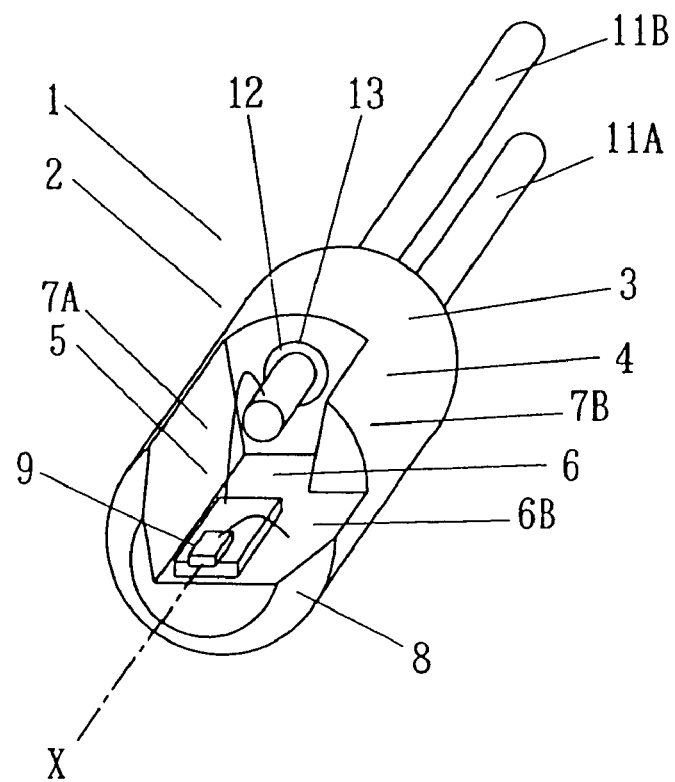
FIG. 8 shows an eighth embodiment of the invention, in a perspective view.

Next, an eighth embodiment of the invention will be described with reference to FIG. 8. Such components as are found also in the embodiment shown in FIG. 1 are identified with the same reference numerals, and their explanations will be omitted; that is, the following description centers on differences from the first embodiment. The main difference from the first embodiment is that the shapes of the base 3 and of the heat sink 4 are modified.

A first modified point lies in the base 3 and the heat sink 4 being given different exterior dimensions. Specifically, the flange surface used as a reference surface for positioning, i.e., the outer circumferential portion of the base 3 that protrudes from the circumference of the heat sink 4, is eliminated. By giving the base 3 and the heat sink 4 such an integral cylindrical shape and thereby eliminating the level difference between them, it is possible to eliminate the restrictions imposed by such a level difference when the fitting position of the semiconductor laser device is adjusted by moving it along the direction of the axis X. This makes adjustment easy.

A second modified point lies in, for higher wire bonding workability, part of the wall 7B of the heat sink 4 being removed, with a flat surface 6B formed instead. The flat surface 6B is flush with the surface 6 of the groove 5, but may be given a height difference relative to the surface 6 of the groove 5. Forming this flat surface 6B helps reduce the restrictions on the shape of the capillary tool used to bond wires to the semiconductor laser element 9 and the submount 10. This helps enhance workability in the fabrication process.

The first and second modified points described above may be carried out separately or simultaneously.

The eighth embodiment can be applied to any of the second to seventh embodiments and to other embodiments.

Figure 9C:
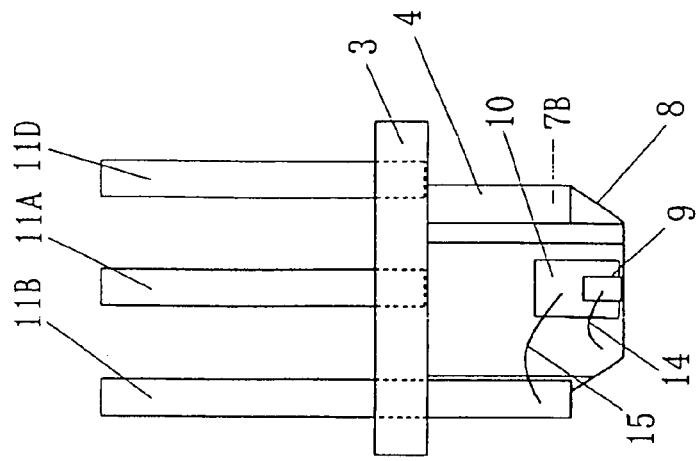
FIG. 9 shows a ninth embodiment of the invention, in a perspective view (a), a front view (b), and a plan view (c).
Figure 9B:
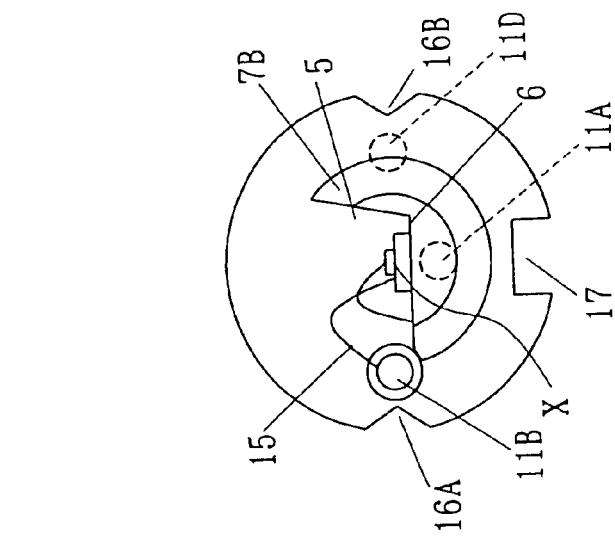
Figure 9A:
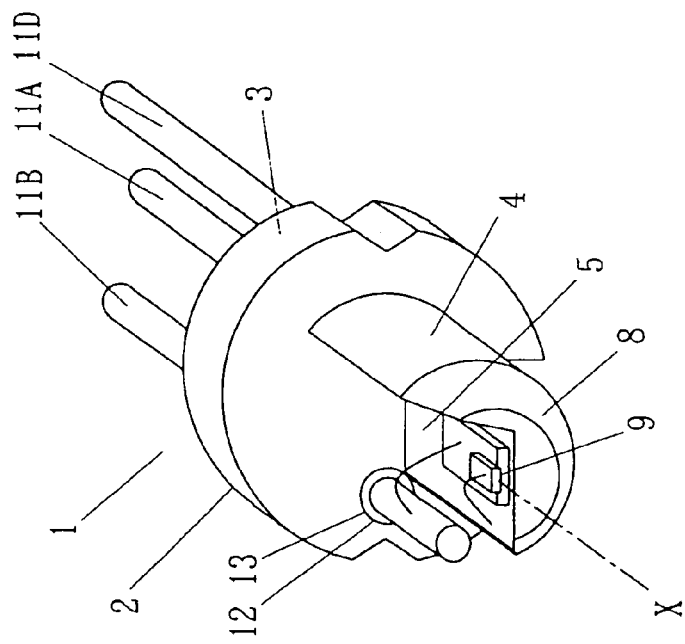

Next, a ninth embodiment of the invention will be described with reference to FIG. 9. Such components as are found also in the embodiment shown in FIG. 1 are identified with the same reference numerals, and their explanations will be omitted; that is, the following description centers on differences from the first embodiment. The main differences from the first embodiment are that a dummy lead pin 11D is provided to make the semiconductor laser device compatible with common three-pin devices, and that one of the left-hand and right-hand walls 7A and 7B formed at both left-hand and right-hand sides of the groove 5 is removed so that a wall 7B is formed at only one of the left-hand and right-hand sides of the flat surface 6.

With one of the walls 7A and 7B removed, the heat sink 4 is L-shaped as seen from the front. In the previous embodiment, the semiconductor laser element 9 is placed on the flat surface 6 that forms the bottom surface of the groove 5. By contrast, in a case where, as in this embodiment, the groove 5 can be regarded as fan-shaped (V-shaped), it is possible to regard the semiconductor laser element 9 as being placed on one of the inner wall surfaces of the groove 5.

The lead pin 11B is not completely housed inside the groove 5, but is fixed to the base 3 in a state insulated from the base 3 and partly located outside the groove 5. The dummy lead pin 11D, like the lead pin 11A, is fixed to the base 3 in a state electrically conductive therewith, with one end of the lead pin 11D joined to the base 3 by welding or the like. The lead pin 11D, like the lead pin 11A, is arranged in a position where it overlaps the heat sink 4 as seen in a plan view projected from the direction of the axis X. The lead pin 11D is arranged in the same position where, in a common three-pin device, a lead pin for outputting a monitoring signal is arranged. This makes the pin arrangement here compatible with that of common three-pin devices, and thus makes it possible to share the same fabrication equipment to fabricate them.

In a device incorporating a monitoring function, the lead pin for outputting the monitoring signal needs to be arranged, like the lead pin 11B, so as not to overlap the heat sink 4 as seen in a plan view. This limits the position where the heat sink 4 can be located. In this embodiment, however, since the lead pin 11D is a dummy lead that does not protrude from the base 3, it is possible to secure a wide area were the heat sink 4 can be located. That is, in the area where a lead pin for outputting a monitoring signal would otherwise be located, it is possible to locate the heat sink 4, specifically, in this example, to permit the wall 7B to protrude therefrom.

As a result, it is possible to locate the upper end of the heat sink 4, which is usually located at the same level as the surface 6, at a level higher than the light emission point or upper surface of the semiconductor laser element 9. The presence of this wall 7B protruding to a level higher than the light emission point or upper surface helps increase the volume or surface area for heat dissipation and thereby achieve satisfactory heat dissipation.

The ninth embodiment can be applied t any of the second to eighth embodiments and to other embodiments.

Next, a tenth embodiment of the invention will be described with reference to FIG. 10. Such components as are found also in the embodiment shown in FIG. 9 are identified with the same reference numerals, and their explanations will be omitted; that is, the following description centers on differences from the ninth embodiment. The difference from the ninth embodiment is that the wall 7 of the heat sink 4 is differently shaped. Specifically, the wall 7 has the summit thereof, which has an acute angle in the ninth embodiment, chamfered so as to be formed into a flat surface 7C. This construction, though slightly less effective in heat dissipation than the ninth embodiment, offers the same effects as the ninth embodiment.

Figure 11A:
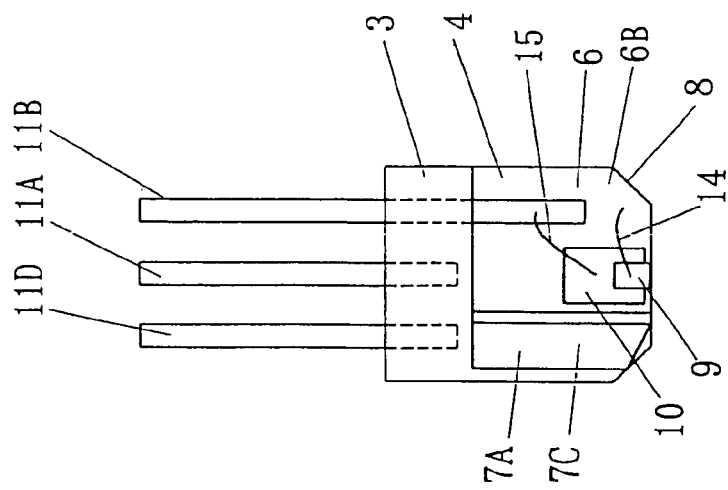
FIG. 11 shows an eleventh embodiment of the invention, in a perspective view (a), a front view (b), and a plan view (c).
Figure 11B:
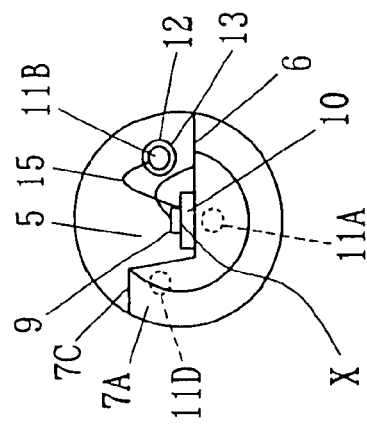
Figure 11C:
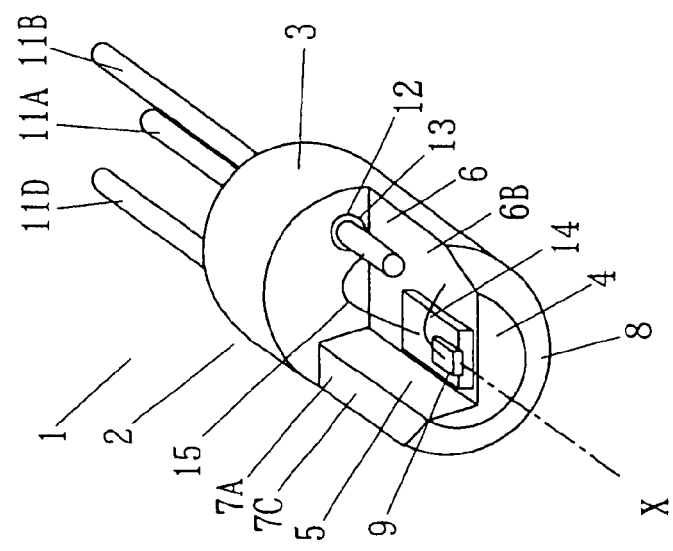

Next, an eleventh embodiment of the invention will be described with reference to FIG. 11. This embodiment is a combination of the embodiment shown in FIG. 8 having the embodiments shown in FIGS. 9 and 10 added thereto. Accordingly, such components as are also found in FIGS. 8 to 10 are identified with the same reference numerals.

The base 3 and the heat sink 4 are given the same diameter so as not to produce a level difference between them. Part of a cylindrical member is cut out to form the heat sink 4, and the remaining part that has not been cut out is used as the base 3. By giving the base 3 and the heat sink 4 such an integral cylindrical shape and thereby eliminating the level difference between them, it is possible to eliminate the restrictions imposed by such a level difference when the fitting position of the semiconductor laser device is adjusted by moving it along the direction of the axis X. This makes adjustment easy.

One end of the lead pin 11B, which is fixed to the base 3 by the insulating member 13, penetrates the base 3 and extends to above the flat surface 6B. The lead pin 11D, like the lead pin 11A, is fixed to the base 3 in a state electrically conductive therewith, with one end of the lead pin 11D joined to the base 3 by welding or the like. The lead pin 11D, like the lead pin 11A, is arranged in a position where it overlaps the heat sink 4 as seen in a plan view projected from the direction of the axis X. The lead pin 11D is arranged in the same position where, in a common three-pin device, a lead pin for outputting a monitoring signal is arranged. This makes the pin arrangement here compatible with that of common three-pin devices, and thus makes it possible to share the same fabrication equipment to fabricate them. The wall 7A has the summit thereof chamfered so as to be formed into a flat surface 7C.

The eleventh embodiment offers the same effects as the eighth to tenth embodiments.

In the embodiments described above, it is also possible to use, as a semiconductor light-emitting element of a different type from the semiconductor laser element 9, a light-emitting diode. It should be understood that many variations and modifications other than those specifically described above in connection with the embodiments are possible within the scope and spirit of the present invention.

INDUSTRIAL APPLICABILITY

A semiconductor laser device according to the present invention can be used as a light source for an optical disk such as a CD, CD-R/RW, DVD, DVD-R/RW, DVD-BlueRay disk, and the like, and in particular as a semiconductor laser device having a compact package suitable for use as a slim (thin) pickup for an optical disk.

The invention claimed is:

1. A semiconductor laser device comprising:
   a cylindrical heat sink having a groove formed therein along an axial direction thereof and having an outer bottom surface thereof formed flat, the groove being increasingly wide in an upward direction and having planar side walls, wherein the distance between the side walls is greater at a top portion of the groove than at the bottom portion of the groove; and
   a semiconductor laser element placed on an inner wall surface of the groove.

2. A semiconductor laser device having a package comprising a base and a heat sink and having a semiconductor laser element placed on the heat sink, wherein the heat sink is cylindrical, in that a groove is formed in the heat sink along an axial direction thereof, the groove being increasingly wide in an upward direction and having planar side walls, wherein the distance between the side walls is greater at a top portion of the groove than at the bottom portion of the groove, in that the semiconductor laser element is placed on an inner wall surface of the groove, and in that the heat sink has an outer bottom surface thereof formed flat.

3. The semiconductor laser device according to one of claims 1 and 2, wherein the groove is formed so deep as to include a center axis of the cylindrical heat sink.

4. The semiconductor laser device according to one of claims 1 and 2, wherein the groove is so shaped as to completely house therein the semiconductor laser element.

5. The semiconductor laser device according to one of claims 1 and 2, wherein the groove is so shaped as to completely house therein the semiconductor laser element along with bonding wires connected thereto.

6. The semiconductor laser device according to one of claims 1 and 2, wherein walls located at both sides of the groove extend to a height higher than the semiconductor laser element.

7. The semiconductor laser device according to one of claims 1 and 2, wherein the groove is formed by cutting off an arc surface of the heat sink equivalent to a center angle of 180 degrees or less.

8. The semiconductor laser device according to claim 2, wherein a lead pin is provided that, at one end thereof, penetrates the base, and the lead pin is, at the other end thereof, located in the groove.

9. The semiconductor laser device according to claim 2, wherein two lead pins are provided that, at one ends thereof, penetrate the base, and the lead pins are, at one ends thereof, located in the groove.

10. The semiconductor laser device according to claim 9, wherein a plane that includes the two lead pins is parallel to an inner bottom surface of the groove.

11. The semiconductor laser device according to one of claims 1 and 2, wherein the heat sink has a tapered surface formed along an outer edge of a tip end thereof.

12. The semiconductor laser device according to claim 2, wherein the base and the heat sink are formed of a same metal.

* * * * *